(12) United States Patent
Kroeger et al.

(10) Patent No.: US 7,464,324 B2
(45) Date of Patent: *Dec. 9, 2008

(54) METHOD AND APPARATUS FOR FORWARD ERROR CORRECTION CODING FOR AN AM IN-BAND ON-CHANNEL DIGITAL AUDIO BROADCASTING SYSTEM

(75) Inventors: Brian William Kroeger, Sykesville, MD (US); Branimir Vojcic, Annandale, VA (US); Raymond L. Pickholtz, Fairfax, VA (US); Ashruf El-Dinary, Clarksville, MD (US)

(73) Assignee: iBiquity Digital Corporation, Columbia, MD (US)

( * ) Notice: Subject to any disclaimer, the term of this patent is extended or adjusted under 35 U.S.C. 154(b) by 1604 days.

This patent is subject to a terminal disclaimer.

(21) Appl. No.: 10/310,105

(22) Filed: Dec. 4, 2002

(65) Prior Publication Data

US 2003/0182616 A1 Sep. 25, 2003

Related U.S. Application Data

(62) Division of application No. 09/438,822, filed on Nov. 11, 1999, now Pat. No. 6,523,147.

(51) Int. Cl.
*H03M 13/03* (2006.01)
*H04L 23/02* (2006.01)
*H04L 5/12* (2006.01)

(52) U.S. Cl. .................. 714/792; 714/790; 375/261

(58) Field of Classification Search .............. None
See application file for complete search history.

(56) References Cited

U.S. PATENT DOCUMENTS

| | | | | |
|---|---|---|---|---|
| 3,488,445 A | * | 1/1970 | Chang | 370/203 |
| 4,379,947 A | * | 4/1983 | Warner | 370/204 |
| 4,425,642 A | * | 1/1984 | Moses et al. | 370/477 |
| 4,534,054 A | * | 8/1985 | Maisel | 381/4 |
| 6,944,803 B2 | * | 9/2005 | Hunt | 714/701 |

* cited by examiner

*Primary Examiner*—Christine T Tu
(74) *Attorney, Agent, or Firm*—Robert P. Lenart, Esq.; Pietragallo Gordon Alfano Bosick & Raspanti, LLP

(57) ABSTRACT

A method of digital audio broadcasting comprises the steps of providing a plurality of bits of digital information to be transmitted, forward error correcting the bits of digital information using a combination of pragmatic trellis code modulation and complementary punctured code, and transmitting the bits of digital information. The step of forward error correcting the bits of digital information can comprise the steps of representing the bits as independently coded in-phase and quadrature signals, applying a first error correcting code to the in-phase signals, and applying a second error correcting code to the quadrature signals. The bits of digital information can be arranged in a plurality of partitions of code, wherein first and second ones of the partitions do not overlap, a third one of the partitions overlaps a first portion of the first and second partitions, and a fourth one of the partitions overlaps a second portion of the first and second partitions. Apparatus for transmitting and receiving digital audio broadcasting signals in accordance with the above method are also provided.

66 Claims, 6 Drawing Sheets

METHOD AND APPARATUS FOR FORWARD ERROR CORRECTION CODING FOR AN AM IN-BAND ON-CHANNEL DIGITAL AUDIO BROADCASTING SYSTEM

CROSS-REFERENCE TO RELATED APPLICATION

This application is a divisional application of U.S. patent application Ser. No. 09/438,822, filed Nov. 11, 1999.

BACKGROUND OF THE INVENTION

This invention relates to methods and apparatus for forward error correction coding, and more particularly to such methods and apparatus for use in digital audio broadcasting systems.

Digital Audio Broadcasting (DAB) is a medium for providing digital-quality audio, superior to existing analog broadcasting formats. AM In-Band, On-Channel (IBOC) to DAB can be transmitted in a hybrid format where a digitally modulated signal coexists with the AM signal, or it can be transmitted in an all-digital format where the removal of the analog signal enables improved digital coverage with reduced interference. The hybrid format allows existing receivers to continue to receive the AM signal while allowing new IBOC receivers to decode the DAB signal. In the future, when IBOC receivers are abundant, a broadcaster may elect to transmit the all-digital format. The DAB signal of the all-digital format is even more robust than the hybrid DAB signal because of allowed increased power of the former with a digital time diversity backup channel. IBOC requires no new spectral allocations because each DAB signal is simultaneously transmitted within the spectral mask of an existing AM channel allocation. IBOC promotes economy of spectrum while enabling broadcasters to supply digital quality audio to their present base of listeners.

U.S. Pat. No. 5,588,022 teaches a method for simultaneously broadcasting analog and digital signals in a standard AM broadcasting channel. An amplitude modulated radio frequency signal having a first frequency spectrum is broadcast. The amplitude modulated radio frequency signal includes a first carrier modulated by an analog program signal. Simultaneously, a plurality of digitally modulated carrier signals are broadcast within a bandwidth that encompasses the first frequency spectrum. Each of the digitally modulated carrier signals is modulated by a portion of a digital program signal. A first group of the digitally modulated carrier signals lies within the first frequency spectrum and is modulated in quadrature with the first carrier signal Second and third groups of the digitally modulated carrier signals lie outside of the first frequency spectrum and are modulated both in-phase and in-quadrature with the first carrier signal. U.S. patent application Ser. No. 09/049,217, assigned to the same assignee as the present invention, discloses another embodiment of an AM Digital Audio Broadcasting system.

Coding for an IBOC DAB system has been described in: B. Kroeger, D. Cammarata, "Robust Modem and Coding Techniques for FM Hybrid IBOC DAB," IEEE Trans. on Broadcasting, Vol. 43, No. 4, pp. 412-420, December 1997. Trellis coded modulation has been proposed for use in AM IBOC DAB systems. Pragmatic trellis coded modulation (PCTM) has been described in: A. Viterbi, et al., "A Pragmatic Approach to Trellis-Coded Modulation," IEEE Communications Magazine, pp. 11-19, July 1989. The use of complementary punctured codes has also been proposed for IBOC DAB systems. Complementary punctured codes have been described in: S. Kallel, "Complementary Punctured Convolution (CPC) Codes and Their Applications," IEEE Trans. Comm., Vol 43, No. 6, pp. 2005-2009, June 1995. The present invention seeks to provide an improved forward error correction method for use in AM IBOC DAB transmitters. Receivers that process signals that were transmitted in accordance with the method are also described.

SUMMARY OF THE INVENTION

The invention provides a method of digital audio broadcasting comprising the steps of providing a plurality of bits of digital information to be transmitted, forward error correcting the bits of digital information using a combination of pragmatic trellis code modulation and complementary punctured code, and transmitting the bits of digital information. The step of forward error correcting the bits of digital information can comprise the steps of representing the bits as independently coded in-phase and quadrature signals, applying a first error correcting code to the in-phase signals, and applying a second error correcting code to the quadrature signals.

The invention also encompasses a method of digital audio broadcasting comprising the steps of providing a plurality of bits of digital information, encoding the plurality of bits of digital information to produce a plurality of partitions of digital information code, wherein first and second ones of the partitions do not overlap, a third one of the partitions overlaps a first portion of the first and second partitions, and a fourth one of the partitions overlaps a second portion of the first and second partitions.

The plurality of partitions can include a main partition, a backup partition, an upper partition, and a lower partition, with the upper partition and the lower partition being non-overlapping. The upper partition and lower partition can be symmetric.

The code can comprise a plurality of symbols and the step of transmitting the plurality of partitions of code can comprise the step of quadrature amplitude modulating a plurality of carrier signals using the symbols to produce in-phase (I) and quadrature (Q) components.

The in-phase and quadrature components can be modulated with independent amplitude shift keying (ASK) signals to produce in-phase and quadrature ASK symbols. One bit of each of the ASK symbols can be uncoded. Each of the ASK symbols can be coded with a first error correction scheme and additional bits of each of the ASK symbols can be coded with a second error correction scheme.

The invention also includes apparatus for digital audio broadcasting in accordance with the above methods.

The invention further encompasses a method of receiving a digital audio broadcasting signal comprising the steps of receiving a plurality of bits of digital information, wherein the bits of digital information have been forward error corrected using a combination of pragmatic trellis code modulation and complementary punctured code, and decoding the bits of digital information to produce an output signal.

The forward error corrected bits of digital information can be independently coded for in-phase and quadrature signals, with a first error correcting code applied to the in-phase signals and a second error correcting code applied to the quadrature signals.

The invention also encompasses a method of receiving a digital audio broadcasting signal comprising the steps of receiving a plurality of bits of digital information, wherein the plurality of bits of digital information are separated into a plurality of partitions of digital information code, wherein first and second ones of the partitions do not overlap, a third one of the partitions overlaps a first portion of the first and second partitions, and a fourth one of the partitions overlaps a second portion of the first and second partitions, and decoding the bits of digital information to produce an output signal.

The plurality of partitions can include a main partition, a backup partition, an upper partition, and a lower partition, with the upper partition and the lower partition being non-overlapping.

The bits of digital information can comprise a plurality of symbols, and the digital audio broadcasting signal can comprise a plurality of carrier signals quadrature amplitude modulated using the symbols to produce in-phase (I) and quadrature (Q) components.

The in-phase and quadrature components can be modulated with independent amplitude shift keying (ASK) signals to produce in-phase and quadrature ASK symbols. One bit of each of the ASK symbols can be uncoded. Alternatively, one bit of each of the ASK symbols can be coded with a first error correction scheme and additional bits of each of the ASK symbols can be coded with a second error correction scheme.

The invention further encompasses a method for receiving a digital audio broadcast signal comprising the steps of receiving a plurality of bits of digital information divided into a plurality of partitions of code, wherein first and second ones of the partitions do not overlap, a third one of the partitions overlaps a first portion of the first and second partitions, and a fourth one of the partitions overlaps a second portion of the first and second partitions and the code includes quadrature amplitude modulated symbols having in-phase (I) and quadrature (Q) components modulated with independent amplitude shift keying (ASK) signals to produce in-phase and quadrature ASK symbols, wherein one bit of each of the ASK symbols is coded with a first error correction scheme and additional bits of each of the ASK symbols are coded with a second error correction scheme, decoding the additional bits of the ASK symbols using soft decision decoding, and decoding the one bit of the ASK symbols using a decoder responsive to the results of the step of decoding the additional bits of the ASK symbols using soft decision decoding.

The step of decoding the additional bits of the ASK symbols using soft decision decoding can comprise the step of applying a soft binary metric to the additional bits of the ASK symbols. The soft binary metric can be a soft limiter. The soft binary metric can be a linear clipper.

The invention also includes apparatus for receiving digital audio broadcasting signals in accordance with the above methods.

DESCRIPTION OF THE PREFERRED EMBODIMENTS

This invention provides a Forward Error Correction (FEC) technique for an AM IBOC (In-Band On-Channel) DAB (Digital Audio Broadcast) system. This FEC technique is herein referred to as Complementary Pragmatic Trellis-Coded Modulation (CPTCM). The CPTCM coding is designed to accommodate the likely interference scenarios encountered in the AM channel.

Figure 1:
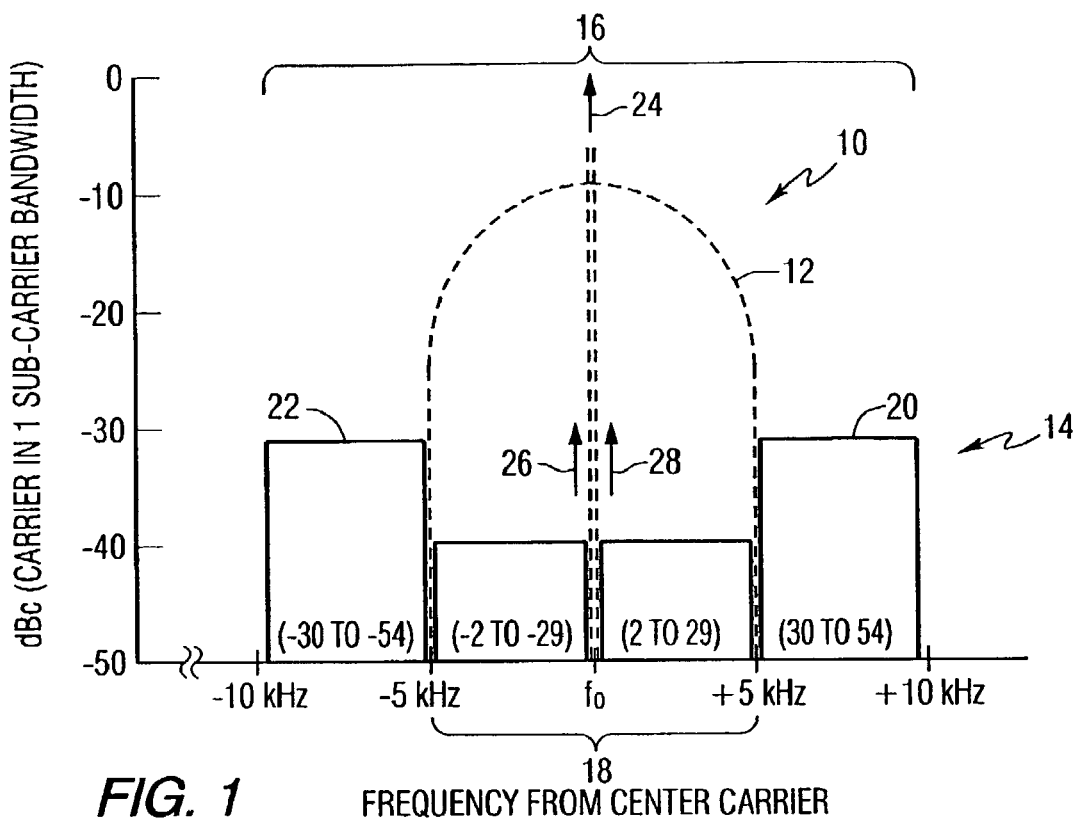
FIG. 1 is a schematic representation of the sub-carrier assignments in an AM hybrid IBOC DAB signal.

Referring to the drawings, FIG. 1 is a schematic representation of the carrier placement of an AM hybrid IBOC DAB signal 10 of the type that can be used to practice the invention. The hybrid format includes the conventional amplitude modulated signal 12 formed by analog modulating a carrier at frequency $f_o$ positioned at the center of the channel, along with a nearly 20 kHz wide DAB signal 14 transmitted beneath the AM signal. The conventional AM signal is bandlimited to ±5 kHz. The spectrum of the IBOC DAB signal is contained within a channel 16 having a bandwidth of 20 kHz. The channel is divided into a central frequency band 18, and upper 20 and lower 22 sidebands. The central frequency band is about 10 kHz wide and encompasses frequencies lying within about plus and minus 5 kHz of the central frequency of the channel. The upper sideband extends from about +5 kHz from the central frequency to about +10 kHz from the central frequency. The lower sideband extends from about −5 kHz from the central frequency to about −10 kHz from the central frequency.

The AM hybrid IBOC DAB signal includes the analog AM signal produced by modulating carrier 24 at frequency $f_o$ plus a plurality of evenly spaced OFDM sub-carriers locations, designated as sub-carrier positions from −54 to +54, and spanning the central frequency band and the upper and lower sidebands. Coded digital information representative of the audio or data signals to be transmitted (program material), is transmitted on the sub-carriers. The AM IBOC DAB signal is digitally modulated using COFDM (Coded Orthogonal Frequency Division Multiplexing). In the preferred embodiment, sub-carriers located in the central frequency band 18 on either side of the analog modulated carrier frequency, $f_o$, are transmitted in twenty eight complementary pairs such that the modulated resultant DAB signal is in quadrature to the analog modulated AM signal. The two sub-carriers 26 and 28 located a positions −1 and +1 use binary phase shift keying to transmit timing information. The remaining sub-carriers in the central frequency band are used to transmit digital information referred to as enhancement information. Sub-carriers in the upper and lower sidebands, at positions from 30 to 54 and −54 to −30 respectively, are QAM modulated sub-carriers. These sub-carriers are used to transmit information referred to as core information. Using this format, the analog modulated carrier and all digitally modulated sub-carriers are transmitted within the channel mask specified for standard AM broadcasting in the United States. Signal processing techniques are employed to reduce the mutual interference between the AM and DAB signals.

Figure 2:
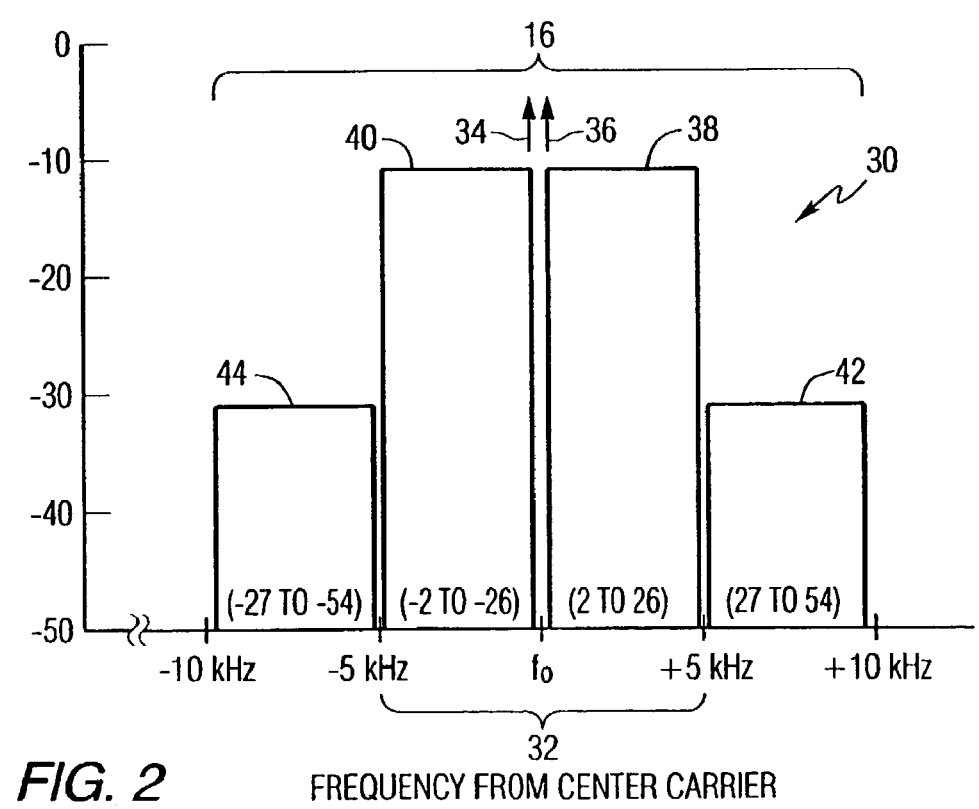
FIG. 2 is schematic representation of the sub-carrier assignments in an AM all-digital IBOC DAB signal.

FIG. 2 is a schematic representation of the spectral placement of an all-digital IBOC DAB broadcasting format 30 that may utilize the present invention. The power of the central frequency band 32 sub-carriers is increased, relative to the hybrid format of FIG. 1. Again, the two sub-carriers 34 and 36 located a locations −1 and +1 use binary phase shift keying to transmit timing information. A core upper sideband 38 is comprised of carriers at locations 2 through 26, and a core lower sideband 40 is comprised of sub-carriers at locations −2 through −26. Two groups 42 and 44 of additional enhancement sub-carriers occupy locations 27 through 54 and −54 through −27 respectively. The all-digital format of FIG. 2 is very similar to the hybrid format except that the AM signal is replaced with a delayed and digitally encoded tuning and backup version of the program material. The central frequency band occupies approximately the same spectral location in both hybrid and all-digital formats. In the all-digital format, there are two options for transmitting the main version of the program material in combination with the tuning and back-up version. The all-digital system has been designed to be constrained within ±10 kHz of the channel central frequency, $f_o$, where the main audio information is transmitted within ±5 kHz of $f_o$, and the less important audio information is transmitted in the wings of the channel mask out to ±10 kHz at a lower power level. This format allows for graceful degradation of the signal while increasing coverage area. The all-digital system carries a digital time diversity tuning and backup channel within the ±5 kHz protected region (assuming the digital audio compression was capable of delivering both the main and audio backup signal within the protected ±5 kHz). The modulation characteristics of the AM all-digital system are based upon the AM IBOC hybrid system, described in U.S. Pat. No. 5,588,022 and modifications thereof, see for example, D. Hartup, D. Alley, D. Goldston, "AM Hybrid IBOC DAB System," presented at the NAB Radio Show, New Orleans, September 1997 and IEEE 47$^{th}$ Annual Broadcast Symposium, Washington, D.C., September 1997.

A significant functional difference between the hybrid and all-digital formats is the particular signal used for the time diversity tuning and backup. The hybrid system uses the analog AM signal, while the all-digital system replaces the analog AM signal with the low-rate digital tuning and backup coded signal. In the all-digital system, both backup diversity signals can occupy the same bandwidth and spectral location. Furthermore, the complication of interference to and from second adjacent signals is eliminated by bandlimiting the DAB signals to ±10 kHz. Since locations of subcarriers potentially impacted by the first adjacent interferers is easily identified, these subcarriers would hold optional digitally encoded information (less important program material) to increase audio quality.

The minimum required embedded digitally encoded information, along with the required diversity backup signal resides in the protected bandwidth region within ±5 kHz from the center carrier. Any additional digitally encoded information (to enhance the audio quality of the program material over the minimum) is placed in the "wings" between 5 kHz and 10 kHz away from the center carrier on each side to avoid any second adjacent interference. This partitioning of digitally encoded segments leads to four approximately equal-size segments (i.e. both main digitally encoded and backup AM or digitally encoded segments in the protected central frequency band ±5 kHz region, and one segment in each of the two wings).

Figure 3:
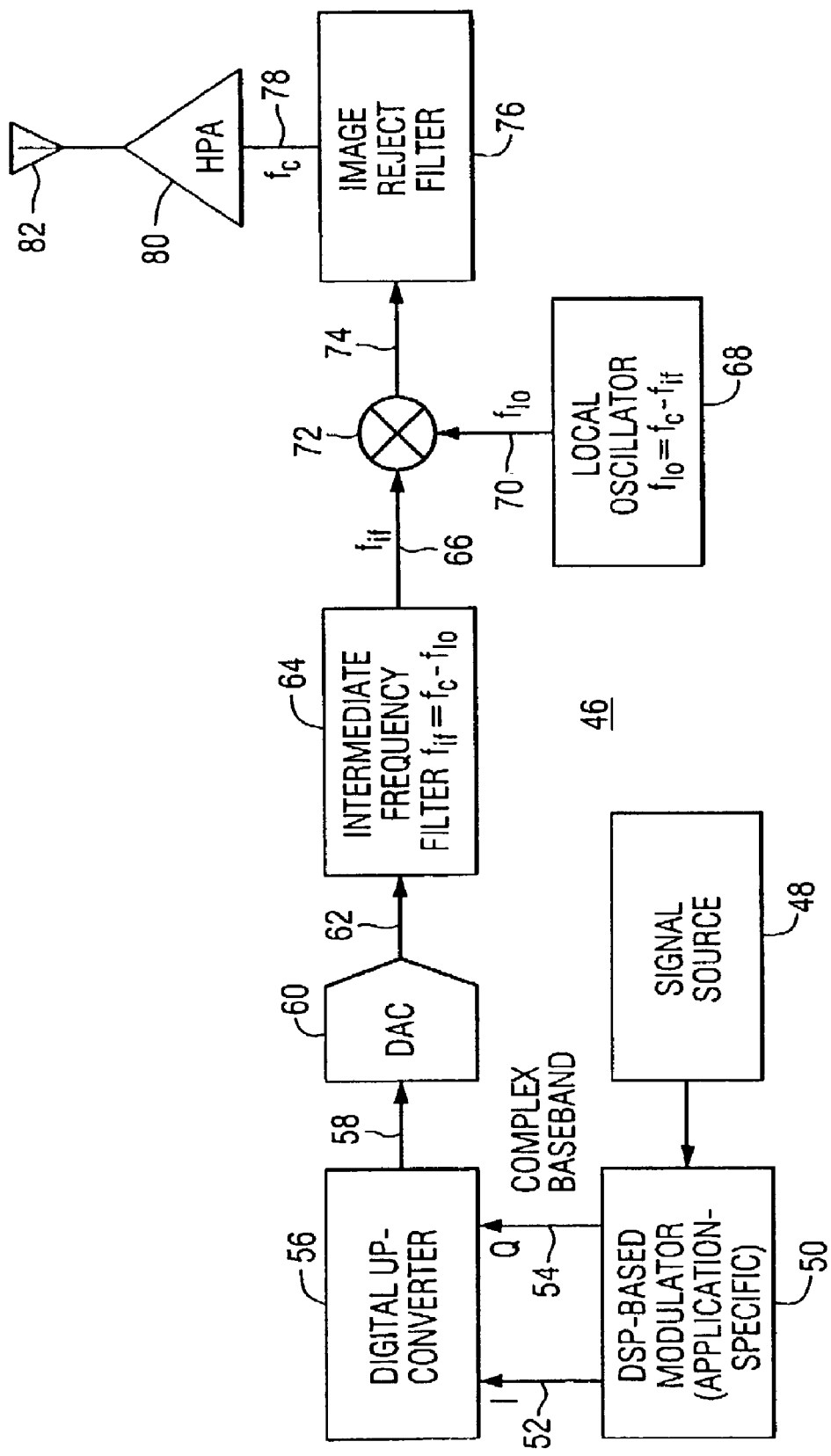
FIG. 3 is a functional block diagram of a transmitter for use in an IBOC DAB system.

FIG. 3 is a block diagram of a DAB transmitter 46 that can broadcast digital audio broadcasting signals in accordance with the present invention. A signal source 48 provides the signal to be transmitted. The source signal may take many forms, for example, an analog program signal and/or a digital information signal. A digital signal processor (DSP) based modulator 50 processes the source signal in accordance with various signal processing techniques, such as source coding, interleaving and forward error correction, to produce in-phase and quadrature components of the complex base band signal on lines 52 and 54. These components are shifted up in frequency, filtered and interpolated to a higher sampling rate in up-converter block 56. This produces digital samples at a rate $f_s$, on intermediate frequency signal $f_{if}$ on line 58. Digital-to-analog converter 60 converts the signal to an analog signal on line 62. An intermediate frequency filter 64 rejects alias frequencies to produce the intermediate frequency signal $f_{if}$ on line 66. A local oscillator 68 produces a signal $f_{lo}$, on line 70, which is mixed with the intermediate frequency signal on line 66 by mixer 72 to produce sum and difference signals on line 74. The sum signal and other unwanted intermodulation components and noise are rejected by image reject filter 76 to produce the modulated carrier signal $f_c$ on line 78. A high power amplifier 80 then sends this signal to an antenna 82.

Figure 4:
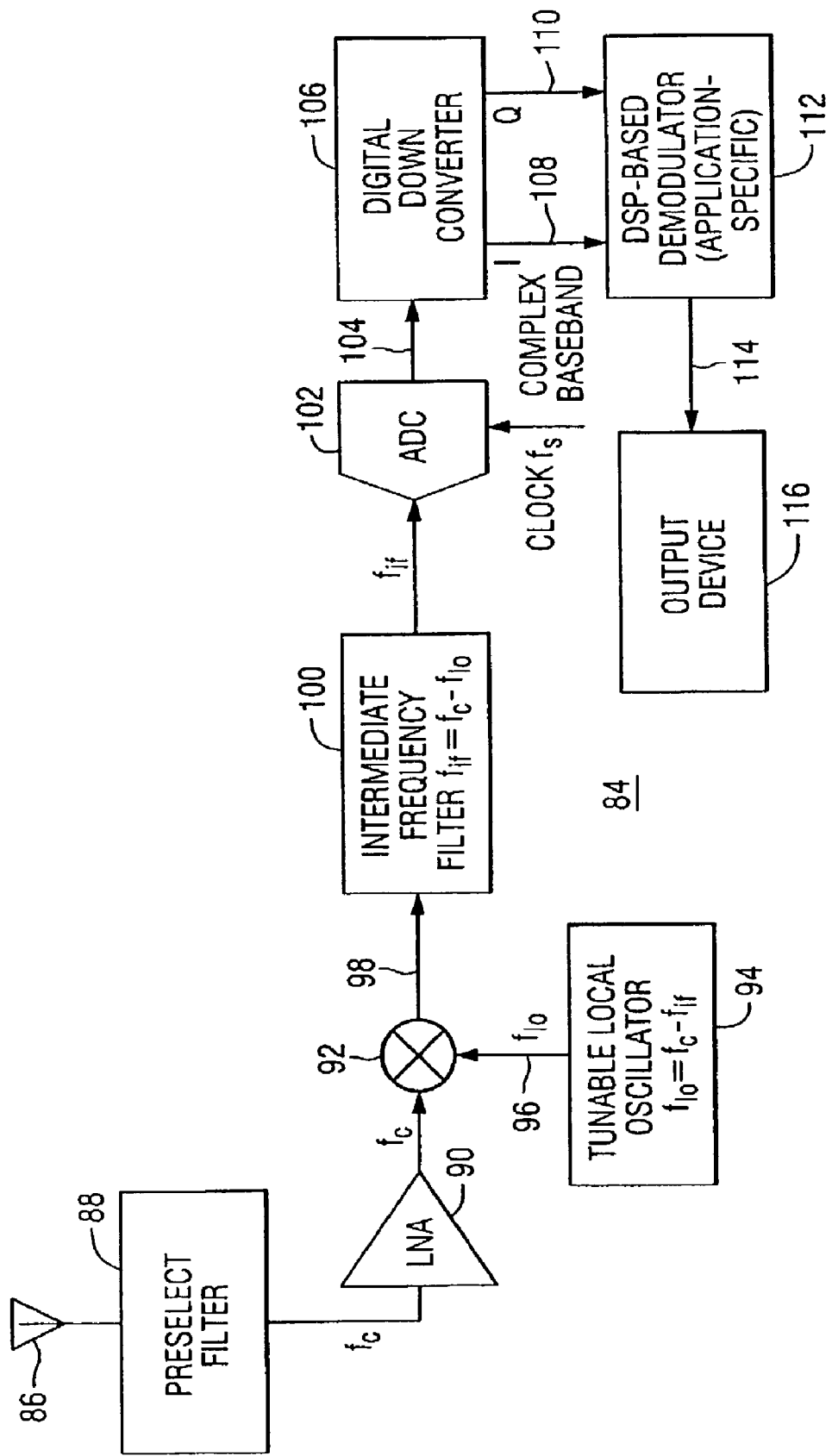
FIG. 4 is a functional block diagram of a receiver for use in an IBOC DAB system.

FIG. 4 is a block diagram of a radio receiver 84 constructed in accordance with this invention. The DAB signal is received on antenna 86. A bandpass preselect filter 88 passes the frequency band of interest, including the desired signal at frequency $f_c$, but rejects the image signal at $f_c - 2f_{if}$ (for a low side lobe injection local oscillator). Low noise amplifier 90 amplifies the signal. The amplified signal is mixed in mixer 92 with a local oscillator signal $f_{lo}$ supplied on line 94 by a tunable local oscillator 96. This creates sum $(f_c+f_{lo})$ and difference $(f_c-f_{lo})$ signals on line 98. Intermediate frequency filter 100 passes the intermediate frequency signal $f_{if}$ and attenuates frequencies outside of the bandwidth of the modulated signal of interest. An analog-to-digital converter 102 operates using a clock signal $f_s$ to produce digital samples on line 104 at a rate $f_s$. Digital down converter 106 frequency shifts, filters and decimates the signal to produce lower sample rate in-phase and quadrature signals on lines 108 and 110. A digital signal processor based demodulator 112 then provides additional signal processing to produce an output signal on line 114 for output device 116.

The present invention is based upon a combination of the pragmatic trellis code modulation (PTCM) technique, and the application of Complementary Punctures Codes to an IBOC DAB system, expanding the complementary-like properties to multiple dimensions. In the preferred embodiment of the invention, each of the sub-carriers is modulated using 64-QAM symbols. The digital information, which may represent for example audio program material and/or data, is interleaved in partitions, and then Forward Error Correction (FEC) coded. The FEC method of this invention is particularly applicable to AM IBOC (In-Band On-Channel) DAB (Digital Audio Broadcast) systems. This FEC technique is hereafter referred to as Complementary Pragmatic Trellis-Coded Modulation (CPTCM). The CPTCM coding is designed to accommodate the likely interference scenarios encountered in the AM channel.

The basic requirements for the CPTCM code include the ability to puncture the original code in various partitions including main, backup, lower sideband and upper sideband. Each of the four partitions must survive as a good code. The performance of the lower and upper sidebands should be optimized as a pair of symmetric complementary non-overlapping partitions. The main and backup partitions each overlap portions of the lower and upper sideband partitions. In the preferred embodiment, the backup and main partitions can be skewed such that the backup partition has better performance than the main partition. Of course, all partitions should be noncatastrophic codes. In the event of a loss of a signal in the other partitions, each of the four partitions must survive as a good code.

The PTCM technique is applied to a QAM symbol by treating the I and Q components as independently coded amplitude shift keyed (ASK) signals. In the preferred embodiment of this invention, each 64-QAM symbol is created by modulating the I or Q component with independent 8-ASK signals. The 8-ASK symbols are generated from 3-bit groups using a unique PTCM mapping. The bits comprising the ASK symbol component are further separated into two categories where one of the bits is typically uncoded (or coded with a forward error correction scheme designated as FECb), and the remaining of the bits are coded using another forward error correction scheme designated as FECa. The typically uncoded bit is designated as ASK0. The pair of coded bits are designated as ASK1 and ASK2. The mapping of the code bit triplets to the 8 levels of the 8-ASK symbols is presented in Table 1.

TABLE 1

Mapping of CPTCM-Coded Bits to 8 Levels of the 8-ASK Symbols.

| MAPPING | Level −3.5 | Level −2.5 | Level −1.5 | Level −0.5 | Level 0.5 | Level 1.5 | Level 2.5 | Level 3.5 |
|---|---|---|---|---|---|---|---|---|
| ASK0 (FECb) | 0 | 0 | 0 | 0 | 1 | 1 | 1 | 1 |
| ASK1 (FECa) | 0 | 0 | 1 | 1 | 0 | 0 | 1 | 1 |
| ASK2 (FECa) | 0 | 1 | 1 | 0 | 0 | 1 | 1 | 0 |

In the decoding process, first FECa decoding is performed on the ASK1 and ASK2 bits. Then the ASK0 bits can be corrected by mapping the ASK1 and ASK2 bit pair to the one of the two possible levels which minimizes the error correction distance. This process of correcting the original symbols involves re-encoding and interleaving of the decoded FECa bits. FECb may be decoded after applying the correction to bit ASK0 from FECa. This multilevel decoding has the effect of yielding a minimum distance of 4 for bit ASK0 (in this 8-ASK example) prior to FECb decoding (if any).

In the preferred embodiment of a transmitter constructed in accordance with the invention, the interleaver is designed for CPTCM with a scalable (2-layer) audio codec. The interleaver is comprised of two parts: a core interleaver spanning 50 subcarriers (25 upper plus 25 lower sideband) and an enhancement interleaver spanning 28 subcarriers (28 complementary subcarriers for the hybrid system, and 28 in each the lower and upper "wings for the all-digital system). Specifically, subcarriers 2 through 54 on either side of the main carrier are utilized in the 20 kHz system. The core interleaver partitions for the hybrid system are transmitted on the sub-carriers located at positions 30 through 54 and −30 through −54. The enhancement interleaver partitions are transmitted on 28 complementary sub-carriers located at positions 2 through 28 and −2 through −28. In the all digital system, core interleaver partitions for the hybrid system are transmitted on the sub-carriers located at positions 2 through 26 and −2 through −26. The enhancement interleaver partitions are transmitted on sub-carriers located at positions 27 through 54 and −27 through −54.

In the preferred embodiment, the CPTCM codes are created through puncturing of industry standard rate 1/3 convolutional, K-7 codes, which can be decoded using a standard Viterbi decoder. Preferably, the codes use generator polynomials described in conventional octal notation as 133, 171 and 165. A generator of 100 can also used for some of the partitions where a systematic code is desired.

The forward error correction of the preferred embodiment of the invention provides good results in both the hybrid system and all-digital system. For the hybrid system as illustrated in FIG. 1, the puncture pattern would provide code bits to an upper sideband and lower sideband. In the preferred embodiment, each sideband is required to provide a good quality code in the case of the other sideband being corrupted. In the preferred embodiment, each sideband is coded using a rate 3/4 code for FECa producing a combined code rate of 3/8 for FECa. Each sideband is coded using a rate 1 code for FECb producing a combined code rate of 1/2 for FECb. Therefore the overall rate of FECa plus FECb is 5/12, or rate 5/6 on the lower or upper sideband.

For the preferred embodiment of the all-digital system as illustrated in FIG. 2, the core FECa puncture pattern is distributed between a main audio channel and a backup audio channel. In the preferred embodiment, the backup channel would be used for fast tuning of the main channel, and when code combined with the backup channel, would provide stereo audio. The main channel is preferably coded at rate 1 while the backup channel will be coded at rate 3/5.

The best rate 3/4 code determined from puncturing the generators [133, 171, 165] was based on the following puncture pattern:

1 0 0
0 1 1
1 0 0 this pattern resulted in a code with a free distance=5, a=4, and c=28. The best r=3/8 pattern studied resulted in free distance=12, a=1, c=3. However, this pattern was based on combining the best rate 3/4 with a less than optimal rate 3/4 puncture pattern:

1 0 0   0 0 1   1 0 1
0 1 1 + 1 0 0 = 1 1 1
1 0 0   0 1 1   1 1 1

This puncture pattern is not used in the preferred embodiment since it is preferable to maximize the performance of the component rate 3/4 codes at the expense of some performance of the combined rate 3/8 code. Combining the best r=3/4 pattern with a cyclically shifted version yielded the following r=3/8 pattern:

1 0 1
1 2 1
1 0 1 or equivalently, 1 0 1
1 1 1
1 0 1
1 0 1
0 1 0 with the second generator polynomial repeated [133, 171, 165, 171]. The properties of this punctured code are free distance=11, a=1, c=3. The puncture pattern was expanded for a period of 6 as shown below:

1 0 1 1 0 1
1 1 1 1 1 1
1 0 1 1 0 1
0 1 0 0 1 0

The elements of the pattern were assigned to the upper sideband and lower sideband. Assignment to upper and lower sidebands resulted in r=3/4 codes for each side with free distance=5, a=4, c=28.

$$\begin{array}{cccccc} L & 0 & U & L & 0 & U \\ U & U & L & U & U & L \\ L & 0 & U & L & 0 & U \\ 0 & L & 0 & 0 & L & 0 \end{array}$$

Core FECa Puncture Pattern

Upper Sideband r=3/4; Lower Sideband r=3/4

To fit the all-digital AM system, code bits from each sideband must be assigned to the main and backup channels. Since in the preferred embodiment, the main channel is coded at r=1 and the backup channel is coded at r=3/5, the upper and lower sidebands combined must contain 6 code bits from main and 10 code bits from backup. Since the main channel is more restrictive, the best way to puncture the hybrid pattern to provide a non-catastrophic r=1 code was determined. When considering combinations of upper and lower that could be used to define the main code bits, out of 225 possible patterns, only 16 were determined to be non-catastrophic.

For each non-catastrophic main puncture pattern, there is a corresponding backup puncture pattern which would yield the r=3/8 pattern given above when combined. The best non-catastrophic backup pattern from this set has a free distance=6, a=1, c=3.

$$\begin{array}{cccccc} 0 & 0 & 0 & L & 0 & U \\ 0 & U & 0 & U & L & L \\ L & 0 & U & L & 0 & U \end{array}$$

FECa Backup Channel Puncture Pattern r=3/5

In theory, a free distance=7 can be obtained from a r=3/5 code. The corresponding non-catastrophic main pattern has free distance=1, a=6, c=70. This is also the best performing main pattern out of the set of 16. For a r=1 systematic code, the properties would be free distance=1, a=1, c=1.

$$\begin{array}{cccccc} L & 0 & U & 0 & 0 & 0 \\ U & L & L & 0 & U & 0 \\ 0 & 0 & 0 & 0 & 0 & 0 \end{array}$$

Core FECa Main Channel Puncture Pattern r=1

The combined main, backup, upper, and lower puncture pattern for the core FECa code is defined as follows:

$$\begin{array}{cccccc} MLa_0 & 0 & MUa_0 & BLa_0 & 0 & BUa_0 \\ MUa_1 & BUa_1 & MLa_1 & BUa_2 & MUa_2 & BLa_1 \\ BLa_2 & 0 & BUa_3 & BLa_3 & 0 & BUa_4 \\ 0 & MLa_2 & 0 & 0 & BLa_4 & 0 \end{array}$$

Core FECa Composite Puncture Pattern Using G=[133, 171, 165, 171]

TABLE 2

Core FECa Summary of Parameters.

| Partition | Rate | $d_f$ | a | c |
|---|---|---|---|---|
| Main | 1 | 1 | 6 | 70 |
| Backup | 3/5 | 6 | 1 | 3 |
| Lower | 3/4 | 5 | 4 | 28 |
| Upper | 3/4 | 5 | 4 | 28 |
| Composite | 3/8 | 11 | 1 | 3 |

Given the generator polynomials [133, 171, 165], a puncture pattern was found to satisfy conditions for both the FECa core hybrid AM and core all-digital AM requirements. This pattern provides a r=3/8 code with free distance=11, a=1, c=3. It can be separated into upper and lower sidebands resulting in r=3/4 codes with free distance=5, a=4, c=28. The upper and lower sideband code bits may then be assigned to a main channel and backup channel for all digital AM. The main channel code is a non-catastrophic r=1 code with free distance=1, a=6, and c=70. The backup channel code is a non-catastrophic r=3/5 code with free distance=6, a=1, and c=3.

The core FECb code was designed using techniques similar to the creation of the FECa code. The overall rate of the core FECb code is 1/2. It is desirable to provide a non-catastrophic rate 1 code in each of the main, backup, lower, and upper partitions. The best performance should be provided on the backup partition, which can be accomplished through a systematic rate 1 code. One possible puncture pattern is $$\begin{array}{cccc} ML_0 & 0 & 0 & MU_0 \\ ML_1 & 0 & MU_1 & 0 \\ BU_0 & BL_0 & BL_1 & BU_1 \end{array}$$

Core FECb Composite Puncture Pattern Using Generators [171, 165, 100]

TABLE 3

Core FECb Summary of Parameters.

| Partition | Rate | $d_f$ | a | c |
|---|---|---|---|---|
| Main | 1 | 1 | 4 | 38 |
| Backup | 1 | 1 | 1 | 1 |
| Lower | 1 | 1 | 4 | 12 |
| Upper | 1 | 1 | 4 | 12 |
| Composite | 1/2 | 4 | 1 | 1 |

However, in the preferred embodiment a systematic puncture pattern for the core FECb code with better rate 1 was chosen. The preferred pattern requiring no coding is:

$MUb_0$  $BUb_1$ $BLb_0$  $MLb_1$

Core FECb Composite Puncture Pattern Using Systematic Generators [100, 100]

TABLE 4

Core FECb Summary of Parameters.

| Partition | Rate | $d_f$ | a | c |
|---|---|---|---|---|
| Main | 1 | 1 | 1 | 1 |
| Backup | 1 | 1 | 1 | 1 |
| Lower | 1 | 1 | 1 | 1 |
| Upper | 1 | 1 | 1 | 1 |
| Composite | 1/2 | 2 | 1 | 1 |

The preferred all-digital enhancement FECa code was determined using techniques similar to the creation of the core FECa code. In the preferred embodiment the overall rate of the upper plus lower enhancement FECa code is rate 1/4. A performance goal is to provide the best rate 1/2 code for the lower and upper partitions. The performance of the best rate 1/4 code (d=20, a=4, c=9, G=[173, 167, 135, 111]) has been found to be slightly better than the rate 1/4 performance of a pair (d=20, a=11, c=36) of replicated standard rate 1/2 codes (d=10, a=11, c=36, G=[133, 171]). However, a computer search revealed that the latter code cannot be divided into a complementary pair of rate 1/2 codes each with a free distance of 10. Alternatively, a pair of optimum rate 1/2 codes can be created by reversing the coefficients of the generator polynomials for one of them. This rate 1/4 code achieves good performance (d=20, a=5, c=11, G=[133, 171, 155, 117]). However, the small improvement in performance over simple replication of the rate 1/2 code does not justify the extra coding complexity. Therefore, it is preferable to replicate the optimum rate 1/2 codes rather than compromise the rate 1/2 performance to achieve a slight improvement after code combining, when possible.

The all-digital enhancement FECb code shall be a systematic rate 1 code for the same reasons as the core FECb code. Although improved performance when code-combining upper and lower sidebands could be achieved if complementary rate 1 codes were used, the optimization of performance on each individual sideband is determined to be more important.

Since the hybrid enhancement partitions are not to be code-combined, the hybrid enhancement FECa code in the preferred embodiment is the industry standard rate 1/2, K=7, G=[133, 171] code yielding a free distance of 10, a=3, c=12. The hybrid enhancement FECb code in the preferred embodiment is a rate 1 systematic code with G=[100], yielding a free distance of 1, a=1, c=1. This choice is the same as the all-digital enhancement FECa and FECb codes.

Interleaver blocks consist of 32 COFDM symbols (baud). There are nominally 8 blocks in a modem frame (interleaver span) for the main and the enhancement partitions. The backup partition is interleaved over only 1 block to permit rapid tuning. The core interleaver consists of an upper sideband and a lower sideband (25 subcarriers each). Each core block sideband holds a total of 800 64-QAM symbols (750 data+50 Training) The enhancement interleaver holds 896 64-QAM symbols (840 data+56 Training).

The scalable audio codec is comprised of 2 layers (core and enhancement). The core layer is mapped onto 64-QAM subcarriers (50 subcarriers on each side) while the enhancement layer is mapped onto 28 64-QAM complementary subcarrier pairs. The core and enhancement layers are coded separately.

Interleaving within each core partition block spanning 25 subcarriers and 32 OFDM symbols performed using the following expression for the row and column indices:

$$\mathrm{row}(k) = \mathrm{mod}\left[11 \cdot \mathrm{mod}(9 \cdot k, 25) + 16 \cdot \mathrm{floor}\left(\frac{k}{25}\right) + 11 \cdot \mathrm{floor}\left(\frac{k}{50}\right), 32\right]$$

$$\mathrm{col}(k) = \mathrm{mod}[9 \cdot k, 25]$$

$$k = 0 \ldots \mathrm{BLOCKS} \cdot 30 \cdot 25 - 1, \text{ where BLOCKS} \equiv 8$$

The index k points to one of the 750 64-QAM symbols within the core partition block. Each of the 64-QAM symbols carries 6 code bits that are mapped to the core partition block. The remaining 50 64-QAM symbols that are not indexed with the row and column indices of the core partition block array are used as training symbols.

TABLE 5

64-QAM Symbol Indices Within A Core Block.

|   |   | 0 | 1 | 2 | 3 | 4 | 5 | 6 | 7 | 8 | 9 | 10 | 11 | 12 |
|---|---|---|---|---|---|---|---|---|---|---|---|---|---|---|
| A = | 0 | 0 | "T" | 728 | 692 | 631 | 595 | 534 | 498 | 437 | 376 | 340 | 279 | 243 |
|   | 1 | 150 | 114 | 53 | 17 | "T" | 745 | 684 | 648 | 587 | 526 | 490 | 429 | 393 |
|   | 2 | 300 | 264 | 203 | 167 | 106 | 70 | 9 | "T" | 737 | 676 | 640 | 579 | 543 |
|   | 3 | 450 | 414 | 353 | 317 | 256 | 220 | 159 | 123 | 62 | 1 | "T" | 729 | 693 |
|   | 4 | 600 | 564 | 503 | 467 | 406 | 370 | 309 | 273 | 212 | 151 | 115 | 54 | 18 |
|   | 5 | "T" | 714 | 653 | 617 | 556 | 520 | 459 | 423 | 362 | 301 | 265 | 204 | 168 |
|   | 6 | 125 | 89 | 28 | "T" | 706 | 670 | 609 | 573 | 512 | 451 | 415 | 354 | 318 |
|   | 7 | 275 | 239 | 178 | 142 | 81 | 45 | "T" | 723 | 662 | 601 | 565 | 504 | 468 |
|   | 8 | 425 | 389 | 328 | 292 | 231 | 195 | 134 | 98 | 37 | "T" | 715 | 654 | 618 |
|   | 9 | 575 | 539 | 478 | 442 | 381 | 345 | 284 | 248 | 187 | 126 | 90 | 29 | "T" |
|   | 10 | 725 | 689 | 628 | 592 | 531 | 495 | 434 | 398 | 337 | 276 | 240 | 179 | 143 |
|   | 11 | 50 | 14 | "T" | 742 | 681 | 645 | 584 | 548 | 487 | 426 | 390 | 329 | 293 |
|   | 12 | 200 | 164 | 103 | 67 | 6 | "T" | 734 | 698 | 637 | 576 | 540 | 479 | 443 |
|   | 13 | 350 | 314 | 253 | 217 | 156 | 120 | 59 | 23 | "T" | 726 | 690 | 629 | 593 |
|   | 14 | 500 | 464 | 403 | 367 | 306 | 270 | 209 | 173 | 112 | 51 | 15 | "T" | 743 |

TABLE 5-continued

64-QAM Symbol Indices Within A Core Block.

| | | | | | | | | | | | | | |
|---|---|---|---|---|---|---|---|---|---|---|---|---|---|
| | 15 | 650 | 614 | 553 | 517 | 456 | 420 | 359 | 323 | 262 | 201 | 165 | 104 | 68 |
| | 16 | 25 | "T" | 703 | 667 | 606 | 570 | 509 | 473 | 412 | 351 | 315 | 254 | 218 |
| | 17 | 175 | 139 | 78 | 42 | "T" | 720 | 659 | 623 | 562 | 501 | 465 | 404 | 368 |
| | 18 | 325 | 289 | 228 | 192 | 131 | 95 | 34 | "T" | 712 | 651 | 615 | 554 | 518 |
| | 19 | 475 | 439 | 378 | 342 | 281 | 245 | 184 | 148 | 87 | 26 | "T" | 704 | 668 |
| | 20 | 625 | 589 | 528 | 492 | 431 | 395 | 334 | 298 | 237 | 176 | 140 | 79 | 43 |
| | 21 | "T" | 739 | 678 | 642 | 581 | 545 | 484 | 448 | 387 | 326 | 290 | 229 | 193 |
| | 22 | 100 | 64 | 3 | "T" | 731 | 695 | 634 | 598 | 537 | 476 | 440 | 379 | 343 |
| | 23 | 250 | 214 | 153 | 117 | 55 | 20 | "T" | 748 | 687 | 626 | 590 | 529 | 493 |
| | 24 | 400 | 364 | 303 | 267 | 206 | 170 | 109 | 73 | 12 | "T" | 740 | 679 | 643 |
| | 25 | 550 | 514 | 453 | 417 | 356 | 320 | 259 | 223 | 162 | 101 | 65 | 4 | "T" |
| | 26 | 700 | 664 | 603 | 567 | 506 | 470 | 409 | 373 | 312 | 251 | 215 | 154 | 118 |
| | 27 | 75 | 39 | "T" | 717 | 656 | 620 | 559 | 523 | 462 | 401 | 365 | 304 | 268 |
| | 28 | 225 | 189 | 128 | 92 | 31 | "T" | 709 | 673 | 612 | 551 | 515 | 454 | 418 |
| | 29 | 375 | 339 | 278 | 242 | 181 | 145 | 84 | 48 | "T" | 701 | 665 | 604 | 568 |
| | 30 | 525 | 489 | 428 | 392 | 331 | 295 | 234 | 198 | 137 | 76 | 40 | "T" | 718 |
| | 31 | 675 | 639 | 578 | 542 | 481 | 445 | 384 | 348 | 287 | 226 | 190 | 129 | 93 |

| | | 13 | 14 | 15 | 16 | 17 | 18 | 19 | 20 | 21 | 22 | 23 | 24 |
|---|---|---|---|---|---|---|---|---|---|---|---|---|---|
| A = | 0 | 182 | 146 | 85 | 49 | "T" | 702 | 666 | 605 | 569 | 508 | 472 | 411 |
| | 1 | 332 | 296 | 235 | 199 | 138 | 77 | 41 | "T" | 719 | 658 | 622 | 561 |
| | 2 | 482 | 446 | 385 | 349 | 288 | 227 | 191 | 130 | 94 | 33 | "T" | 711 |
| | 3 | 632 | 596 | 535 | 499 | 438 | 377 | 341 | 280 | 244 | 183 | 147 | 86 |
| | 4 | "T" | 746 | 685 | 649 | 588 | 527 | 491 | 430 | 394 | 333 | 297 | 236 |
| | 5 | 107 | 71 | 10 | "T" | 738 | 677 | 641 | 580 | 544 | 483 | 447 | 386 |
| | 6 | 257 | 221 | 160 | 124 | 63 | 2 | "T" | 730 | 694 | 633 | 597 | 536 |
| | 7 | 407 | 371 | 310 | 274 | 213 | 152 | 116 | 55 | 19 | "T" | 747 | 686 |
| | 8 | 557 | 521 | 460 | 424 | 363 | 302 | 266 | 205 | 169 | 108 | 72 | 11 |
| | 9 | 707 | 671 | 610 | 574 | 513 | 452 | 416 | 355 | 319 | 259 | 222 | 161 |
| | 10 | 82 | 46 | "T" | 724 | 663 | 602 | 566 | 505 | 469 | 408 | 372 | 311 |
| | 11 | 232 | 196 | 135 | 99 | 38 | "T" | 716 | 655 | 619 | 558 | 522 | 451 |
| | 12 | 382 | 346 | 285 | 249 | 188 | 127 | 91 | 30 | "T" | 708 | 672 | 611 |
| | 13 | 532 | 496 | 435 | 399 | 338 | 277 | 241 | 180 | 144 | 83 | 47 | "T" |
| | 14 | 682 | 646 | 585 | 549 | 488 | 427 | 391 | 330 | 294 | 233 | 197 | 136 |
| | 15 | 7 | "T" | 735 | 699 | 638 | 577 | 541 | 480 | 444 | 383 | 347 | 286 |
| | 16 | 157 | 121 | 60 | 24 | "T" | 727 | 691 | 630 | 594 | 533 | 497 | 436 |
| | 17 | 307 | 271 | 210 | 174 | 113 | 52 | 16 | "T" | 744 | 683 | 647 | 586 |
| | 18 | 457 | 421 | 360 | 324 | 263 | 202 | 166 | 105 | 69 | 8 | "T" | 736 |
| | 19 | 607 | 571 | 510 | 474 | 413 | 352 | 316 | 255 | 219 | 158 | 122 | 61 |
| | 20 | "T" | 721 | 660 | 624 | 563 | 502 | 466 | 405 | 369 | 308 | 272 | 211 |
| | 21 | 132 | 96 | 35 | "T" | 713 | 652 | 616 | 555 | 519 | 458 | 422 | 361 |
| | 22 | 282 | 246 | 185 | 149 | 88 | 27 | "T" | 705 | 669 | 608 | 572 | 511 |
| | 23 | 432 | 396 | 335 | 299 | 238 | 177 | 141 | 80 | 44 | "T" | 722 | 661 |
| | 24 | 582 | 546 | 485 | 449 | 388 | 327 | 291 | 230 | 194 | 133 | 97 | 36 |
| | 25 | 732 | 696 | 635 | 599 | 538 | 477 | 441 | 380 | 344 | 283 | 247 | 186 |
| | 26 | 57 | 21 | "T" | 749 | 688 | 627 | 591 | 530 | 494 | 433 | 397 | 336 |
| | 27 | 207 | 171 | 110 | 74 | 13 | "T" | 741 | 680 | 644 | 583 | 547 | 486 |
| | 28 | 357 | 321 | 260 | 224 | 163 | 102 | 66 | 5 | "T" | 733 | 697 | 636 |
| | 29 | 507 | 471 | 410 | 374 | 313 | 252 | 216 | 155 | 119 | 58 | 22 | "T" |
| | 30 | 657 | 621 | 560 | 524 | 463 | 402 | 366 | 305 | 269 | 208 | 172 | 111 |
| | 31 | 32 | "T" | 710 | 674 | 613 | 552 | 516 | 455 | 419 | 358 | 322 | 261, |

Figure 5:
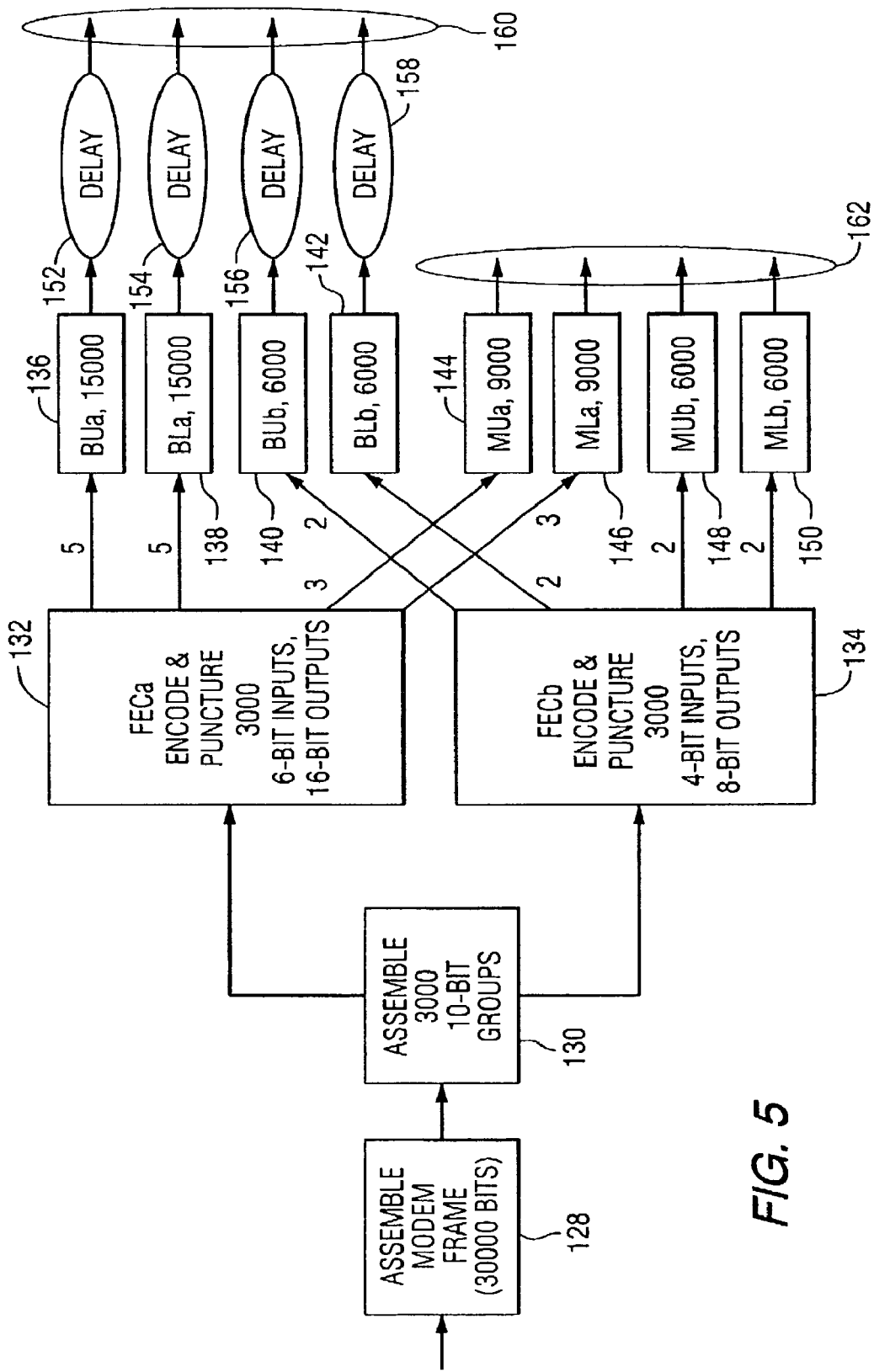
FIG. 5 is a functional block diagram of a core interleaver that may be used in an AM IBOC DAB transmitter that transmits signals in accordance with this invention.

The 30000 core information bits comprising each modem frame are coded and assembled in groups of bits from the puncture patterns, as defined previously and illustrated in FIG. 5. In FIG. 5, block 128 shows that the 30,000 bits are assembled into a modem frame. These bits are divided into 3000 10-bit groups as shown in block 130. Block 132 shows that six bits of each 10-bit group are encoded and punctured according to FECa, while block 134 shows that the other four bits of each 10-bit group are encoded and punctured in accordance with FECb. The FECa encoded and punctured bits are assigned to backup upper partition 136, the backup lower partition 138, the main upper partition 144 and the main lower partition 146. The FECb encoded and punctured bits are assigned to backup upper partition 140, the backup lower partition 142, the main upper partition 148 and the main lower partition 150. These groupings are mapped into the core interleaver using the expressions presented in Table 6. Delay ovals 152, 154, 156 and 158 show that the backup partitions are delayed with respect to the main partitions. The backup symbols are then delivered on lines 160 and the main symbols are delivered on lines 162.

Core interleaver indices: k, b and p are defined as follows:
k=Block index, 0 to 749 symbols in each core block, 0 to 839 symbols in each enhancement block;
b=Block number, 0 to 7 within each modem frame; and
p=PTCM bit mapping within each 64-QAM symbol, with (IASK0=0, IASK1=1, IASK2=2, QASK2=3, QASK1=4, QASK0=5).

TABLE 6

Core Interleaver Mapping.

| Partition $X_{k,b,p}$ | N, n = 0 ... N − 1 | k index in block b | b block # | p I&Q,ASK mapping |
|---|---|---|---|---|
| $BUb_{k,b,p}$ | 6000 | mod(n, 750) | floor(n/750) | 0 |
| $BLb_{k,b,p}$ | 6000 | mod(n + 7, 750) | floor(n/750) | 0 |
| $BUa_{k,b,p}$ | 15000 | mod(mod(n,1875),750) | floor(n/1875) | 1 + floor[mod(n,1875)/750] |
| $BLa_{k,b,p}$ | 15000 | mod(mod(n,1875) + 7, 750) | floor(n/1875) | 1 + floor[mod(n,1875)/750] |
| $MUb_{k,b,p}$ | 6000 | mod(n,750) | mod[3n + floor(n/3000),8] | 5 |
| $MLb_{k,b,p}$ | 6000 | mod(n,750) | mod[3n + floor(n/3000) + 3,8] | 5 |
| $MUa_{k,b,p}$ | 9000 | mod(mod(n,1125) + 375, 750) | mod[3n,8] | 4 − floor[mod(n,1125)/750] |
| $MLa_{k,b,p}$ | 9000 | mod(mod(n,1125) + 382, 750) | mod[3n + 3,8] | 4 − floor[mod(n,1125)/750] |

Figure 6:
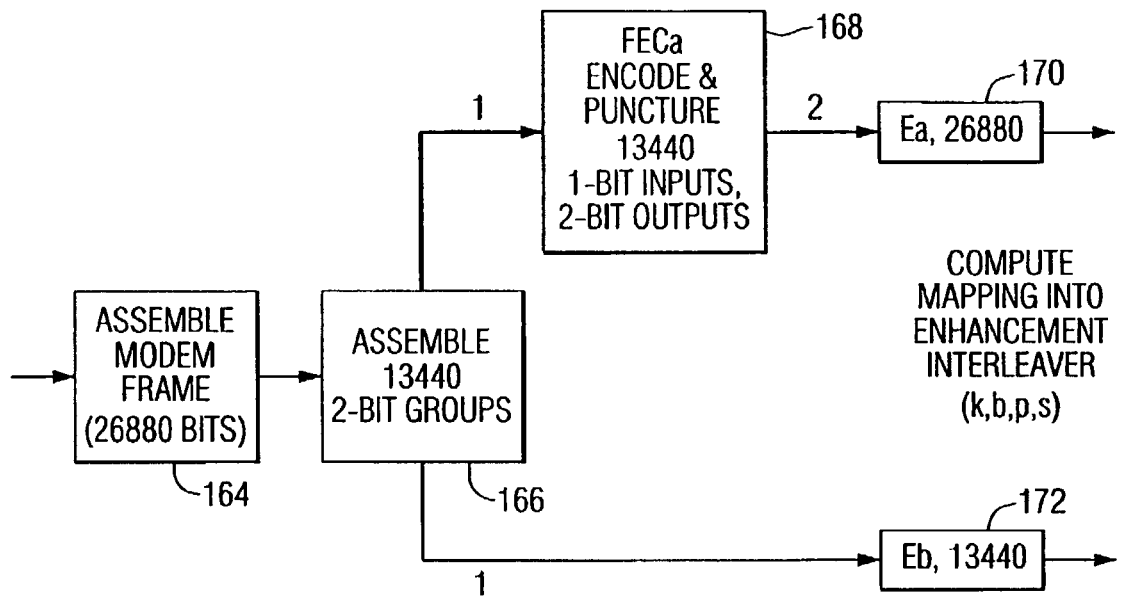
FIG. 6 is a functional block diagram of an enhancement interleaver that may be used in an AM IBOC DAB transmitter that transmits signals in accordance with this invention.

FIG. 6 is a functional block diagram of the enhancement partition block interleaver. Block 164 shows that the 26880 enhancement bits are assembled into a modem frame. These bits are then divided into 13440 2-bit groups as shown in block 166. One bit of each 2-bit group is encoded and punctured according to FECa as shown in block 168. This encoding and puncturing results in 2-bit outputs that are assigned to enhancement partition 170. The other bit of the 2-bit groups in block 166 is assigned to enhancement partition 172. The interleaving of FIG. 7 within each enhancement partition block spanning 28 subcarriers and 32 OFDM symbols is performed using the following expression for the row and column indices:

$$row(k) = mod\left[11 \cdot mod(9 \cdot k, 28) + 16 \cdot floor\left(\frac{k}{28}\right) + 11 \cdot floor\left(\frac{k}{56}\right), 32\right]$$

$$col(k) = mod[9 \cdot k, 28]$$

$$k = 0 \ldots BLOCKS \cdot 30 \cdot 28 - 1, \text{ where } BLOCKS \equiv 8$$

The index k points to one of the 840 64-QAM symbols within the enhancement partition block. Each of the 64-QAM symbols carries 6 code bits that are mapped to the enhancement partition block. The remaining 56 64-QAM symbols that are not indexed with the row and column indices of the enhancement partition block array are used as training symbols.

TABLE 7

64-QAM Symbol Indices Within An Enhancement Block.

|  |  | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|---|
| A = | 0 | 0 | "T" | 834 | 775 | 715 | 657 | 598 | 539 | 480 | 421 | 390 | 331 | 272 | 213 | 154 |
|  | 1 | 168 | 137 | 78 | 19 | "T" | 825 | 766 | 707 | 648 | 589 | 558 | 499 | 440 | 381 | 322 |
|  | 2 | 336 | 305 | 246 | 187 | 128 | 69 | 10 | "T" | 816 | 757 | 726 | 667 | 608 | 549 | 490 |
|  | 3 | 504 | 473 | 414 | 355 | 296 | 237 | 178 | 119 | 60 | 1 | "T" | 835 | 776 | 717 | 658 |
|  | 4 | 672 | 641 | 582 | 523 | 464 | 405 | 346 | 287 | 228 | 169 | 138 | 79 | 20 | "T" | 826 |
|  | 5 | "T" | 809 | 750 | 691 | 632 | 573 | 514 | 455 | 396 | 337 | 306 | 247 | 188 | 129 | 70 |
|  | 6 | 140 | 109 | 50 | "T" | 800 | 741 | 682 | 623 | 564 | 505 | 474 | 415 | 356 | 297 | 238 |
|  | 7 | 308 | 277 | 218 | 159 | 100 | 41 | "T" | 791 | 732 | 673 | 642 | 583 | 524 | 465 | 406 |
|  | 8 | 476 | 445 | 386 | 327 | 268 | 209 | 150 | 91 | 32 | "T" | 810 | 751 | 692 | 633 | 574 |
|  | 9 | 644 | 613 | 554 | 495 | 436 | 377 | 318 | 258 | 200 | 141 | 110 | 51 | "T" | 801 | 742 |
|  | 10 | 812 | 781 | 722 | 663 | 604 | 545 | 486 | 427 | 368 | 309 | 278 | 219 | 160 | 101 | 42 |
|  | 11 | 56 | 25 | "T" | 831 | 772 | 713 | 654 | 595 | 536 | 477 | 446 | 387 | 328 | 269 | 210 |
|  | 12 | 224 | 193 | 134 | 75 | 16 | "T" | 822 | 763 | 704 | 645 | 614 | 555 | 496 | 437 | 378 |
|  | 13 | 392 | 361 | 302 | 243 | 184 | 125 | 66 | 7 | "T" | 813 | 782 | 723 | 664 | 605 | 546 |
|  | 14 | 560 | 529 | 470 | 411 | 352 | 293 | 234 | 175 | 116 | 57 | 26 | "T" | 832 | 773 | 714 |
|  | 15 | 728 | 697 | 638 | 579 | 520 | 461 | 402 | 343 | 284 | 225 | 194 | 135 | 76 | 17 | "T" |
|  | 16 | 28 | "T" | 806 | 747 | 688 | 629 | 570 | 511 | 452 | 393 | 362 | 303 | 244 | 185 | 126 |
|  | 17 | 196 | 165 | 106 | 47 | "T" | 797 | 738 | 679 | 620 | 561 | 530 | 471 | 412 | 353 | 294 |
|  | 18 | 364 | 333 | 274 | 215 | 156 | 97 | 38 | "T" | 788 | 729 | 698 | 639 | 580 | 521 | 462 |
|  | 19 | 532 | 501 | 442 | 383 | 324 | 265 | 206 | 147 | 88 | 29 | "T" | 807 | 748 | 689 | 630 |
|  | 20 | 700 | 669 | 610 | 551 | 492 | 433 | 374 | 315 | 256 | 197 | 168 | 107 | 48 | "T" | 798 |
|  | 21 | "T" | 837 | 778 | 719 | 660 | 601 | 542 | 483 | 424 | 365 | 334 | 275 | 216 | 157 | 98 |
|  | 22 | 112 | 81 | 22 | "T" | 828 | 769 | 710 | 651 | 592 | 533 | 502 | 443 | 384 | 325 | 266 |
|  | 23 | 280 | 249 | 190 | 131 | 72 | 13 | "T" | 819 | 760 | 701 | 670 | 611 | 552 | 493 | 434 |
|  | 24 | 448 | 417 | 358 | 299 | 240 | 181 | 122 | 63 | 4 | "T" | 838 | 779 | 720 | 661 | 602 |
|  | 25 | 616 | 585 | 526 | 467 | 408 | 349 | 290 | 231 | 172 | 113 | 82 | 23 | "T" | 829 | 770 |
|  | 26 | 784 | 753 | 694 | 635 | 576 | 517 | 458 | 399 | 340 | 281 | 250 | 191 | 132 | 73 | 14 |
|  | 27 | 84 | 53 | "T" | 803 | 744 | 685 | 626 | 587 | 508 | 449 | 418 | 359 | 300 | 241 | 182 |
|  | 28 | 252 | 221 | 162 | 103 | 44 | "T" | 794 | 735 | 676 | 617 | 586 | 527 | 468 | 409 | 350 |
|  | 29 | 420 | 389 | 330 | 271 | 212 | 153 | 94 | 35 | "T" | 785 | 754 | 695 | 636 | 577 | 518 |
|  | 30 | 588 | 557 | 496 | 439 | 380 | 321 | 262 | 203 | 144 | 85 | 54 | "T" | 804 | 745 | 686 |
|  | 31 | 756 | 725 | 666 | 607 | 548 | 489 | 430 | 371 | 312 | 253 | 222 | 163 | 104 | 45 | "T" |

TABLE 7-continued

64-QAM Symbol Indices Within An Enhancement Block.

|   |    | 15  | 16  | 17  | 18  | 19  | 20  | 21  | 22  | 23  | 24  | 25  | 26  | 27  |
|---|----|-----|-----|-----|-----|-----|-----|-----|-----|-----|-----|-----|-----|-----|
| A = | 0  | 95  | 36  | "T" | 786 | 755 | 696 | 637 | 578 | 519 | 460 | 401 | 342 | 283 |
|   | 1  | 203 | 204 | 145 | 86  | 55  | "T" | 805 | 746 | 687 | 628 | 569 | 510 | 451 |
|   | 2  | 431 | 372 | 313 | 254 | 223 | 164 | 105 | 46  | "T" | 796 | 737 | 678 | 619 |
|   | 3  | 599 | 540 | 481 | 422 | 391 | 332 | 273 | 214 | 155 | 96  | 37  | "T" | 787 |
|   | 4  | 767 | 708 | 649 | 590 | 559 | 500 | 441 | 382 | 323 | 264 | 205 | 146 | 87  |
|   | 5  | 11  | "T" | 817 | 758 | 727 | 668 | 609 | 550 | 491 | 432 | 373 | 314 | 255 |
|   | 6  | 179 | 120 | 61  | 2   | "T" | 836 | 777 | 718 | 659 | 600 | 541 | 482 | 423 |
|   | 7  | 347 | 288 | 229 | 170 | 139 | 80  | 21  | "T" | 827 | 768 | 709 | 650 | 591 |
|   | 8  | 515 | 456 | 397 | 338 | 307 | 248 | 189 | 130 | 71  | 12  | "T" | 818 | 759 |
|   | 9  | 683 | 624 | 565 | 506 | 475 | 416 | 357 | 298 | 239 | 180 | 121 | 62  | 3   |
|   | 10 | "T" | 792 | 733 | 674 | 643 | 584 | 525 | 466 | 407 | 348 | 289 | 230 | 171 |
|   | 11 | 151 | 92  | 33  | "T" | 811 | 752 | 693 | 634 | 575 | 516 | 457 | 398 | 339 |
|   | 12 | 319 | 260 | 201 | 142 | 111 | 52  | "T" | 802 | 743 | 684 | 625 | 566 | 507 |
|   | 13 | 487 | 428 | 369 | 310 | 279 | 220 | 161 | 102 | 43  | "T" | 793 | 734 | 675 |
|   | 14 | 655 | 596 | 537 | 478 | 447 | 388 | 329 | 270 | 211 | 152 | 93  | 34  | "T" |
|   | 15 | 823 | 764 | 705 | 646 | 615 | 556 | 497 | 438 | 379 | 320 | 261 | 202 | 143 |
|   | 16 | 67  | 8   | "T" | 814 | 783 | 724 | 665 | 606 | 547 | 488 | 429 | 370 | 311 |
|   | 17 | 235 | 176 | 117 | 58  | 27  | "T" | 833 | 774 | 715 | 656 | 597 | 538 | 479 |
|   | 18 | 403 | 344 | 285 | 226 | 195 | 136 | 77  | 18  | "T" | 824 | 765 | 706 | 647 |
|   | 19 | 571 | 512 | 453 | 394 | 363 | 304 | 245 | 186 | 127 | 68  | 9   | "T" | 815 |
|   | 20 | 739 | 680 | 621 | 562 | 531 | 472 | 413 | 354 | 295 | 236 | 177 | 118 | 59  |
|   | 21 | 39  | "T" | 789 | 730 | 699 | 640 | 581 | 522 | 463 | 404 | 345 | 286 | 227 |
|   | 22 | 207 | 148 | 89  | 30  | "T" | 808 | 749 | 690 | 631 | 572 | 513 | 454 | 395 |
|   | 23 | 375 | 316 | 257 | 198 | 167 | 108 | 49  | "T" | 799 | 740 | 681 | 622 | 563 |
|   | 24 | 543 | 484 | 425 | 366 | 335 | 276 | 217 | 158 | 99  | 40  | "T" | 790 | 731 |
|   | 25 | 711 | 652 | 593 | 534 | 503 | 444 | 385 | 326 | 267 | 208 | 149 | 90  | 31  |
|   | 26 | "T" | 820 | 761 | 702 | 871 | 612 | 553 | 494 | 435 | 376 | 317 | 258 | 199 |
|   | 27 | 123 | 64  | 5   | "T" | 839 | 780 | 721 | 662 | 603 | 544 | 485 | 426 | 307 |
|   | 28 | 291 | 232 | 173 | 114 | 83  | 24  | "T" | 830 | 771 | 712 | 653 | 594 | 535 |
|   | 29 | 459 | 400 | 341 | 282 | 251 | 192 | 133 | 74  | 15  | "T" | 821 | 762 | 703 |
|   | 30 | 627 | 568 | 509 | 450 | 419 | 360 | 301 | 242 | 183 | 124 | 65  | 6   | "T" |
|   | 31 | 795 | 736 | 677 | 618 | 587 | 528 | 469 | 410 | 351 | 292 | 233 | 174 | 115, |

The 26880 enhancement information bits comprising each modem frame are coded and assembled in groups of bits from the puncture patterns, as defined previously and illustrated in FIG. 6. These groupings are mapped into the enhancement interleaver using the expressions presented in Table 8.

The enhancement interleaver indices k, b and p are defined as follows:
k=Block index, 0 to 839 symbols in each core block,
b=Block number, 0 to 7 within each modem frame, and
p=PTCM bit mapping within each 64-QAM symbol, with (IASK0=0, IASK1=1, IASK2=2, QASK2=3, QASK1=4, QASK0=5).

TABLE 8

Enhancement Interleaver Mapping.

| Partition $X_{k,b,p}$ | N<br>n = 0 ... N − 1 | k<br>index in block b | b<br>block # | p<br>I&Q,ASK mapping |
|---|---|---|---|---|
| $EUb_{k,b,p}$ | 13440 | k = mod(n,840) | mod(3n + floor(n/840),8] | 5*floor(n/6720) |
| $ELb_{k,b,p}$ | 13440 | k = mod(n,840) | mod(3n + floor(n/840) + 3,8] | 5*floor(n/6720) |
| $EUa_{k,b,p}$ | 26880 | k = mod(n,840) | mod(3n + floor(n/840),8] | 1 + mod[n + floor(n/6720),4] |
| $ELa_{k,b,p}$ | 26880 | k = mod(n,840) | mod(3n + floor(n/840) + 3,8] | 1 + mod[n + floor(n/6720),4] |

Figure 7:
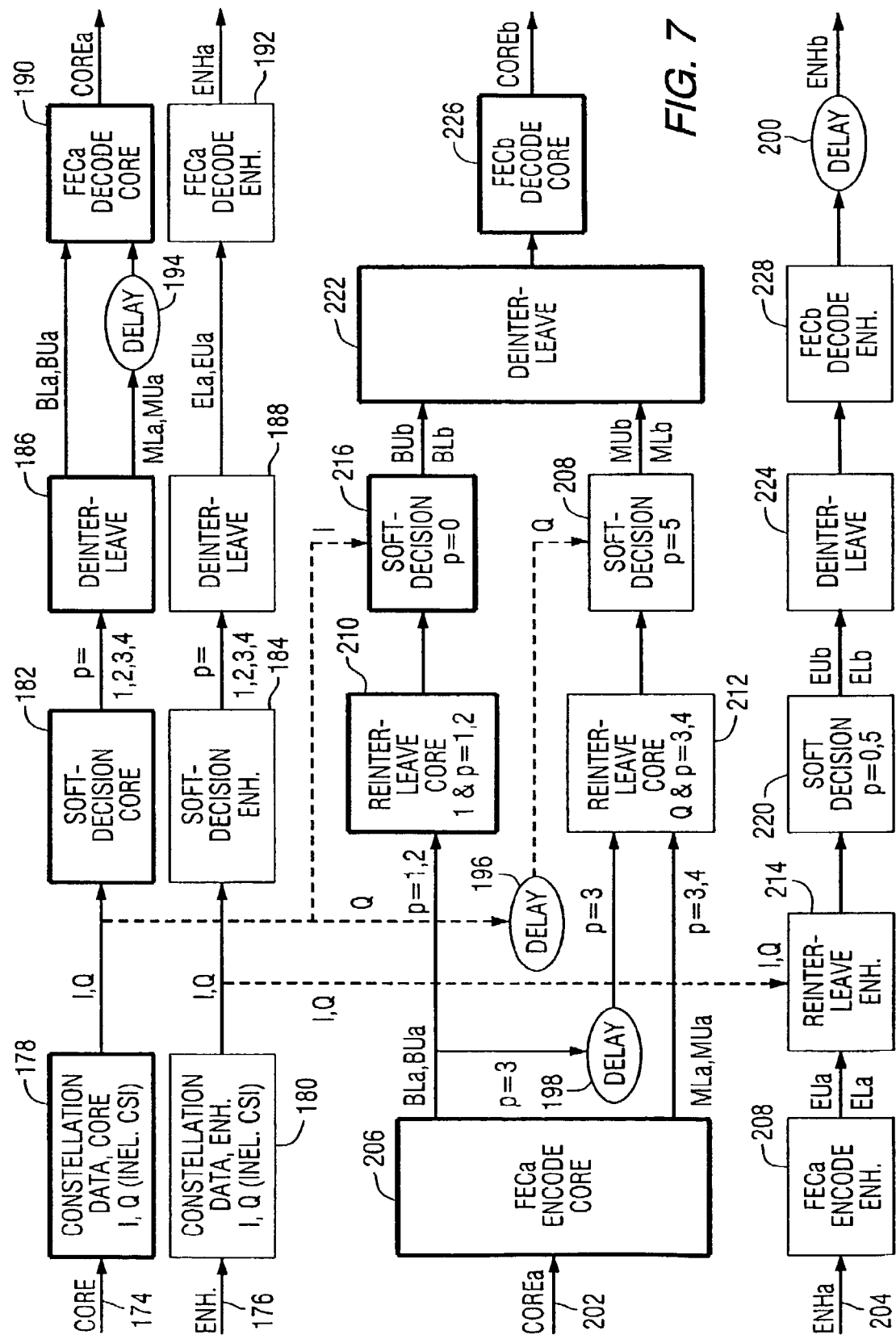
FIG. 7 is a diagram that illustrates a robust soft metric for an 8-ASK IBOC DAB signal.

A functional block diagram of the deinterleaver and FEC decoder portions of a receiver is shown in FIG. 7. The constellation data at the inputs 174 and 176 consists of the I and Q values for each of the 64-QAM symbols which have been demodulated and normalized to the constellation grid. Blocks 178 and 180 show that Channel State Information (CSI) is associated with each I and Q value to permit subsequent soft-decision detection of the bits in blocks 182 and 184. The soft decision outputs are deinterleaved as illustrated by blocks 186 and 188 and decoded as illustrated by blocks 190 and 192. The purpose of the four delay elements 194, 196, 198 and 200 in the figure is to time-align the backup audio information with the main and enhancement audio information. This delay compensates for the diversity delay experienced by the backup audio information inserted at the transmitter.

The core and enhancement bits are also input on lines 202 and 204 and are subjected to FECa encoding as shown in blocks 206 and 208. The encoded bits are reinterleaved as shown by blocks 210, 212 and 214. Soft decisions are then produced as shown in blocks 216, 218 and 220. The soft decisions are deinterleaved as shown in blocks 222 and 224 and decoded as illustrated by blocks 226 and 228. Blocks 178, 182, 186, 190, 206, 210, 216, 222 and 226 in FIG. 8 indicate functions that must be processed on interleaver block boundaries (as opposed to modem frame boundaries) in order to minimize delay in processing the backup audio information.

Assuming K information bits per symbol, the binary metric for the k-th bit is given by:

$$\lambda_{i,k} = \ln\frac{Pr(b_k=1|y_i)}{Pr(b_k=0|y_i)} = \ln\frac{\sum_{all\,s_j^{1,k}} f_n(y_i - s_j^{1,k})}{\sum_{all\,s_j^{0,k}} f_n(y_i - s_j^{0,k})}, k=1,\ldots,K$$

For soft metric generation, since binary codes are used for PTCM, it is necessary to obtain soft binary metrics from noisy M-ary symbols. Suppose that the received noise symbol is:

$$y_i = s_i + n_i, i = 1, \ldots N$$

Assuming K information bits per symbol, the binary metric for the k-th bit is given by:

$$\lambda_{i,k} = \ln\frac{Pr(b_k=1|y_i)}{Pr(b_k=0|y_i)} = \ln\frac{\sum_{all\,s_j^{1,k}} f_n(y_i - s_j^{1,k})}{\sum_{all\,s_j^{0,k}} f_n(y_i - s_j^{0,k})}, k=1,\ldots,K$$

where $s_j^{1,k}$ stands for the j-th symbol in the constellation that has bit value 1 in the k-th bit position (and similarly for $s_j^{0,k}$, the j-th symbol in the constellation that has bit value 0 in the k-th bit) and $$f_n(x) = \frac{1}{\sqrt{2\pi\sigma^2}}\exp\left[-\frac{x^2}{2\sigma^2}\right]$$

is the probability density function of noise, assuming AWG noise. The above formula for the soft bit metric applies for any constellation. The main disadvantage of this approach is that it requires computations of exponentials. An approximate metric can be obtained by approximating the sum of exponentials by the maximum exponential, so that $$\lambda_{i,k} \cong \ln\frac{\max_{all\,s_j^{1,k}} \exp\left[-\frac{1}{2\sigma_i^2}(y_i - s_j^{1,k})^2\right]}{\max_{all\,s_j^{0,k}} \exp\left[-\frac{1}{2\sigma_i^2}(y_i - s_j^{0,k})^2\right]}, k=1,\ldots,K$$

$$\cong \frac{1}{\sigma_i^2}\left[y_i(s^{1,k}_{min} - s^{0,k}_{min}) - 0.5(s^{1,k\,2}_{min} - s^{0,k\,2}_{min})\right]$$

where irrelevant terms and constants are dropped and $s^{1,k}_{min}$ denotes the symbol closest to $y_i$ that has 1 in the k-th bit position (and similarly for $s^{0,k}_{min}$). Thus, by means of this approximation (so called log-max approximation) we avoid calculating exponentials. However, as a consequence of using this approximation a fraction of dB can be lost in performance.

Figure 8:
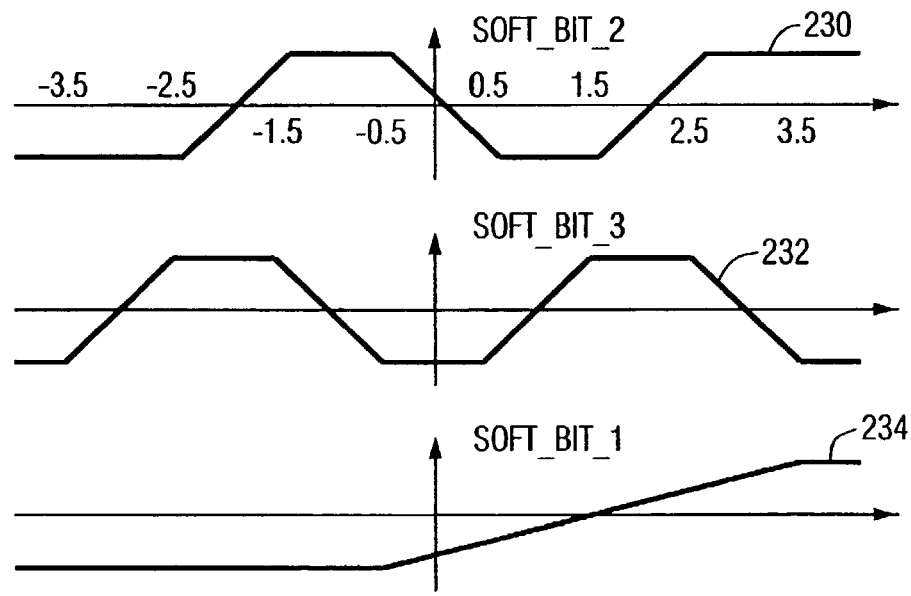
FIG. 8 is a functional block diagram of a deinterleaver and FEC decoder that may be used in an AM IBOC DAB receiver that processes signals in accordance with this invention.

FIG. 8 is a graphic representation of the soft metrics 230, 232 and 234 with linear clipper. Using this clipper achieves improvements of soft metrics for the impulsive noise scenario. Let us assume that the noisy symbol sample is passed through a nonlinearity of the form (soft limiter or linear clipper). It is desired to construct a soft metric that performs approximately the same in AWGN as previously considered metrics, yet that will have smaller degradation in impulsive noise. That is, it has to have enough "softness" to maximize the performance in AWGN and to limit metric samples when impulsive noise is present, i.e. to prevent the excessive metric growth when large noise samples are present. Toward that goal consider the 8-ASK constellation and nonlinearities shown in FIG. 8.

Based on the value of a received noisy signal we construct soft metrics by passing the received sample through two different nonlinearities shown in FIG. 8. The constructed soft bit values are further divided by the corresponding values of average noise power.

The nonlinearity for bit 1 (MSB) is positioned depending upon decisions for bits 2 and 3. In this figure we show an example when a di-bit 10 is decided for bits 2 and 3. Thus, we can see that this metric performs almost the same as other soft metrics in the absence of impulsive noise, but outperforms other soft metrics if impulsive noise is present. It can also outperform hard decision decoding. In summary, the soft metric can be represented by:

$$\text{soft\_out}_i = \frac{F(y_i)}{\sigma_i^2}$$

where y represents the received noisy symbol and F(.) is the desired nonlinearity.

While the present invention has been described in terms of its preferred embodiment, it will be understood by those skilled in the art that various modifications can be made to the disclosed embodiment without departing from the scope of the invention as set forth in the claims.

What is claimed is:

1. A method of digital audio broadcasting, said method comprising the steps of:
   providing a plurality of bits of digital information to be transmitted;
   forward error correcting said bits of digital information using a combination of pragmatic trellis code modulation and complementary punctured code; and
   transmitting said corrected bits of digital information.

2. The method of claim 1, wherein the step of forward error correcting said bits of digital information comprises the steps of:
   representing said bits as independently coded in-phase and quadrature signals;
   applying a first error correcting code to said in-phase signals; and
   applying a second error correcting code to said quadrature signals.

3. A method of digital audio broadcasting, said method comprising the steps of:
   providing a plurality of bits of digital information;
   encoding said plurality of bits of digital information to produce a plurality of partitions of digital information code, wherein first and second ones of said partitions do not overlap, a third one of said partitions overlaps a first portion of said first and second partitions, and a fourth one of said partitions overlaps a second portion of said first and second partitions; and
   transmitting said plurality of partitions of code.

4. The method of claim 3, wherein:
said plurality of partitions include a main partition, a backup partition, an upper partition, and a lower partition, said upper partition and said lower partition being non-overlapping.

5. The method of claim 4, wherein:
said upper partition and said lower partition are symmetric.

6. The method of claim 3, wherein the code comprises a plurality of symbols and the step of transmitting said plurality of partitions of code comprises the step of:
quadrature amplitude modulating a plurality of carrier signals using the symbols to produce in-phase (I) and quadrature (Q) components.

7. The method of claim 6, further comprising the step of:
modulating said in-phase and quadrature components with independent amplitude shift keying (ASK) signals to produce in-phase and quadrature ASK symbols.

8. The method of claim 7, wherein one bit of each of said ASK symbols is uncoded.

9. The method of claim 7, wherein one bit of each of said ASK symbols is coded with a first error correction scheme and additional bits of each of said ASK symbols are coded with a second error correction scheme.

10. A method of receiving a digital audio broadcasting signal, said method comprising the steps of:
receiving a plurality of bits of digital information, wherein said bits of digital information have been forward error corrected using a combination of pragmatic trellis code modulation and complementary punctured code; and
decoding said bits of digital information to produce an output signal.

11. The method of claim 10, wherein the forward error corrected bits of digital information are independently coded for in-phase and quadrature signals, with a first error correcting code applied to said in-phase signals and a second error correcting code applied to said quadrature signals.

12. A method of receiving a digital audio broadcasting signal, said method comprising the steps of:
receiving a plurality of bits of digital information, wherein said plurality of bits of digital information are separated into a plurality of partitions of digital information code, wherein first and second ones of said partitions do not overlap, a third one of said partitions overlaps a first portion of said first and second partitions, and a fourth one of said partitions overlaps a second portion of said first and second partitions; and
decoding said bits of digital information to produce an output signal.

13. The method of claim 12, wherein:
said plurality of partitions include a main partition, a backup partition, an upper partition, and a lower partition, said upper partition and said lower partition being non-overlapping.

14. The method of claim 13, wherein:
said upper partition and said lower partition are symmetric.

15. The method of claim 12, wherein the bits of digital information comprise a plurality of symbols and the digital audio broadcasting signal comprises a plurality of carrier signals quadrature amplitude modulated using the symbols to produce in-phase (I) and quadrature (Q) components.

16. The method of claim 15, further comprising the step of:
modulating said in-phase and quadrature components with independent amplitude shift keying (ASK) signals to produce in-phase and quadrature ASK symbols.

17. The method of claim 16, wherein one bit of each of said ASK symbols is uncoded.

18. The method of claim 16, wherein one bit of each of said ASK symbols is coded with a first error correction scheme and additional bits of each of said ASK symbols are coded with a second error correction scheme.

19. A method for receiving a digital audio broadcast signal, said method comprising the steps of:
receiving a plurality of bits of digital information divided into a plurality of partitions of code, wherein first and second ones of said partitions do not overlap, a third one of said partitions overlaps a first portion of said first and second partitions, and a fourth one of said partitions overlaps a second portion of said first and second partitions and said code includes quadrature amplitude modulated symbols having in-phase (I) and quadrature (Q) components modulated with independent amplitude shift keying (ASK) signals to produce in-phase and quadrature ASK symbols, wherein one bit of each of said ASK symbols is coded with a first error correction scheme and additional bits of each of said ASK symbols are coded with a second error correction scheme;
decoding said additional bits of said ASK symbols using soft decision decoding; and
decoding said one bit of said ASK symbols using a decoder responsive to the results of the step of decoding said additional bits of said ASK symbols using soft decision decoding.

20. The method of claim 19, wherein the step of decoding said additional bits of said ASK symbols using soft decision decoding comprises the step of:
applying a soft binary metric to said additional bits of said ASK symbols.

21. The method of claim 20, wherein the soft binary metric is a soft limiter.

22. The method of claim 21, wherein the soft binary metric is a linear clipper.

23. An apparatus for digital audio broadcasting, said apparatus comprising:
means for forward error correcting a plurality of bits of digital information using a combination of pragmatic trellis code modulation and complementary punctured code; and
means for transmitting said corrected bits of digital information.

24. The apparatus of claim 23, wherein the corrected bits of digital information are transmitted as independently coded in-phase and quadrature signals with a first error correcting code applied to said in-phase signals and a second error correcting code applied to said quadrature signals.

25. An apparatus for digital audio broadcasting, said apparatus comprising:
means for encoding a plurality of bits of digital information to produce a plurality of partitions of digital information code, wherein first and second ones of said partitions do not overlap, a third one of said partitions overlaps a first portion of said first and second partitions, and a fourth one of said partitions overlaps a second portion of said first and second partitions; and
means for transmitting said plurality of partitions of code.

26. The apparatus of claim 25, wherein:
said plurality of partitions include a main partition, a backup partition, an upper partition, and a lower partition, said upper partition and said lower partition being non-overlapping.

27. The apparatus of claim 26, wherein:
said upper partition and said lower partition are symmetric.

28. The apparatus of claim 25, wherein the code comprises a plurality of symbols transmitted by quadrature amplitude modulating a plurality of carrier signals using the symbols to produce in-phase (I) and quadrature (Q) components.

29. The apparatus of claim 28, wherein the in-phase and quadrature components are modulated with independent amplitude shift keying (ASK) signals to produce in-phase and quadrature ASK symbols.

30. The apparatus of claim 29, wherein one bit of each of said ASK symbols is uncoded.

31. The apparatus of claim 29, wherein one bit of each of said ASK symbols is coded with a first error correction scheme and additional bits of each of said ASK symbols are coded with a second error correction scheme.

32. An apparatus for receiving a digital audio broadcasting signal, said apparatus comprising:
means for receiving a plurality of bits of digital information, wherein said bits of digital information have been forward error corrected using a combination of pragmatic trellis code modulation and complementary punctured code; and
means for decoding said bits of digital information to produce an output signal.

33. The apparatus of claim 32, wherein the forward error corrected bits of digital information are independently coded for in-phase and quadrature signals, with a first error correcting code applied to said in-phase signals and a second error correcting code applied to said quadrature signals.

34. An apparatus for receiving a digital audio broadcasting signal, said apparatus comprising:
means for receiving a plurality of bits of digital information, wherein said plurality of bits of digital information are separated into a plurality of partitions of digital information code, wherein first and second ones of said partitions do not overlap, a third one of said partitions overlaps a first portion of said first and second partitions, and a fourth one of said partitions overlaps a second portion of said first and second partitions; and
means for decoding said bits of digital information to produce an output signal.

35. The apparatus of claim 34, wherein:
said plurality of partitions include a main partition, a backup partition, an upper partition, and a lower partition, said upper partition and said lower partition being non-overlapping.

36. The apparatus of claim 35, wherein:
said upper partition and said lower partition are symmetric.

37. The apparatus of claim 34, wherein the bits of digital information comprise a plurality of symbols and the digital audio broadcasting signal comprises a plurality of carrier signals quadrature amplitude modulated using the symbols to produce in-phase (I) and quadrature (Q) components.

38. The apparatus of claim 37, wherein the in-phase and quadrature components are modulated with independent amplitude shift keying (ASK) signals to produce in-phase and quadrature ASK symbols.

39. The apparatus of claim 38, wherein one bit of each of said ASK symbols is uncoded.

40. The apparatus of claim 38, wherein one bit of each of said ASK symbols is coded with a first error correction scheme and additional bits of each of said ASK symbols are coded with a second error correction scheme.

41. An apparatus for receiving a digital audio broadcast signal, said apparatus comprising:
means for receiving a plurality of bits of digital information divided into a plurality of partitions of code, wherein first and second ones of said partitions do not overlap, a third one of said partitions overlaps a first portion of said first and second partitions, and a fourth one of said partitions overlaps a second portion of said first and second partitions and said code includes quadrature amplitude modulated symbols having in-phase (I) and quadrature (Q) components modulated with independent amplitude shift keying (ASK) signals to produce in-phase and quadrature ASK symbols, wherein one bit of each of said ASK symbols is coded with a first error correction scheme and additional bits of each of said ASK symbols are coded with a second error correction scheme; and
means for decoding said additional bits of said ASK symbols using soft decision decoding and for decoding said one bit of said ASK symbols using the decoded additional bits of said ASK symbols.

42. The apparatus of claim 41, wherein the means for decoding said additional bits of said ASK symbols using soft decision decoding comprises:
means for applying a soft binary metric to said additional bits of said ASK symbols.

43. The apparatus of claim 42, wherein the soft binary metric is a soft limiter.

44. The apparatus of claim 42, wherein the soft binary metric is a linear clipper.

45. An apparatus for digital audio broadcasting, said apparatus comprising:
a processor for forward error correcting a plurality of bits of digital information using a combination of pragmatic trellis code modulation and complementary punctured code; and
an antenna for transmitting said corrected bits of digital information.

46. The apparatus of claim 45, wherein the corrected bits of digital information are transmitted as independently coded in-phase and quadrature signals with a first error correcting code applied to said in-phase signals and a second error correcting code applied to said quadrature signals.

47. An apparatus for digital audio broadcasting, said apparatus comprising:
a processor for encoding a plurality of bits of digital information to produce a plurality of partitions of digital information code, wherein first and second ones of said partitions do not overlap, a third one of said partitions overlaps a first portion of said first and second partitions, and a fourth one of said partitions overlaps a second portion of said first and second partitions; and
an antenna for transmitting said plurality of partitions of code.

48. The apparatus of claim 47, wherein:
said plurality of partitions include a main partition, a backup partition, an upper partition, and a lower partition, said upper partition and said lower partition being non-overlapping.

49. The apparatus of claim 48, wherein:
said upper partition and said lower partition are symmetric.

50. The apparatus of claim 47, wherein the code comprises a plurality of symbols transmitted by quadrature amplitude modulating a plurality of carrier signals using the symbols to produce in-phase (I) and quadrature (Q) components.

51. The apparatus of claim 50, wherein the in-phase and quadrature components are modulated with independent amplitude shift keying (ASK) signals to produce in-phase and quadrature ASK symbols.

52. The apparatus of claim 51, wherein one bit of each of said ASK symbols is uncoded.

53. The apparatus of claim 51, wherein one bit of each of said ASK symbols is coded with a first error correction scheme and additional bits of each of said ASK symbols are coded with a second error correction scheme.

54. An apparatus for receiving a digital audio broadcasting signal, said apparatus comprising:
- an antenna for receiving a plurality of bits of digital information, wherein said bits of digital information have been forward error corrected using a combination of pragmatic trellis code modulation and complementary punctured code; and
- a processor for decoding said bits of digital information to produce an output signal.

55. The apparatus of claim 54, wherein the forward error corrected bits of digital information are independently coded for in-phase and quadrature signals, with a first error correcting code applied to said in-phase signals and a second error correcting code applied to said quadrature signals.

56. An apparatus for receiving a digital audio broadcasting signal, said apparatus comprising:
- an antenna for receiving a plurality of bits of digital information, wherein said plurality of bits of digital information are separated into a plurality of partitions of digital information code, wherein first and second ones of said partitions do not overlap, a third one of said partitions overlaps a first portion of said first and second partitions, and a fourth one of said partitions overlaps a second portion of said first and second partitions; and
- a processor for decoding said bits of digital information to produce an output signal.

57. The apparatus of claim 56, wherein:
said plurality of partitions include a main partition, a backup partition, an upper partition, and a lower partition, said upper partition and said lower partition being non-overlapping.

58. The apparatus of claim 57, wherein:
said upper partition and said lower partition are symmetric.

59. The apparatus of claim 56, wherein the bits of digital information comprise a plurality of symbols and the digital audio broadcasting signal comprises a plurality of carrier signals quadrature amplitude modulated using the symbols to produce in-phase (I) and quadrature (Q) components.

60. The apparatus of claim 59, wherein the in-phase and quadrature components are modulated with independent amplitude shift keying (ASK) signals to produce in-phase and quadrature ASK symbols.

61. The apparatus of claim 60, wherein one bit of each of said ASK symbols is uncoded.

62. The apparatus of claim 60, wherein one bit of each of said ASK symbols is coded with a first error correction scheme and additional bits of each of said ASK symbols are coded with a second error correction scheme.

63. An apparatus for receiving a digital audio broadcast signal, said apparatus comprising:
- an antenna for receiving a plurality of bits of digital information divided into a plurality of partitions of code, wherein first and second ones of said partitions do not overlap, a third one of said partitions overlaps a first portion of said first and second partitions, and a fourth one of said partitions overlaps a second portion of said first and second partitions and said code includes quadrature amplitude modulated symbols having in-phase (I) and quadrature (Q) components modulated with independent amplitude shift keying (ASK) signals to produce in-phase and quadrature ASK symbols, wherein one bit of each of said ASK symbols is coded with a first error correction scheme and additional bits of each of said ASK symbols are coded with a second error correction scheme; and
- a processor for decoding said additional bits of said ASK symbols using soft decision decoding and for decoding said one bit of said ASK symbols using the decoded additional bits of said ASK symbols.

64. The apparatus of claim 63, wherein the means for decoding said additional bits of said ASK symbols using soft decision decoding comprises:
means for applying a soft binary metric to said additional bits of said ASK symbols.

65. The apparatus of claim 64, wherein the soft binary metric is a soft limiter.

66. The apparatus of claim 64, wherein the soft binary metric is a linear clipper.

* * * * *